United States Patent
Lee et al.

(10) Patent No.: US 8,184,444 B2
(45) Date of Patent: May 22, 2012

(54) ELECTRODE PAD FOR MOUNTING ELECTRONIC COMPONENT AND STRUCTURE FOR MOUNTING ELECTRONIC COMPONENT

(75) Inventors: Byoung Hwa Lee, Gyunggi-do (KR); Sung Kwon Wi, Seoul (KR); Hong Yeon Cho, Gyunggi-do (KR); Dong Seok Park, Seoul (KR); Sang Soo Park, Gyunggi-do (KR); Min Cheol Park, Gyunggi-do (KR)

(73) Assignee: Samsung Electro-Mechanics Co., Ltd, Gyunggi-Do (KR)

( * ) Notice: Subject to any disclaimer, the term of this patent is extended or adjusted under 35 U.S.C. 154(b) by 372 days.

(21) Appl. No.: 12/425,068

(22) Filed: Apr. 16, 2009

(65) Prior Publication Data

US 2010/0032193 A1   Feb. 11, 2010

(30) Foreign Application Priority Data

Aug. 8, 2008   (KR) .................. 10-2008-0077972

(51) Int. Cl.
*H05K 7/00*   (2006.01)
(52) U.S. Cl. ........ 361/760; 361/767; 361/768; 257/720; 257/730
(58) Field of Classification Search .............. 361/760, 361/767, 768; 257/720–730
See application file for complete search history.

(56) References Cited

U.S. PATENT DOCUMENTS

| | | | |
|---|---|---|---|
| 5,473,514 A | 12/1995 | Nagano | |
| 5,715,147 A * | 2/1998 | Nagano | 361/813 |
| 2001/0053069 A1 * | 12/2001 | Haba et al. | 361/760 |
| 2004/0246691 A1 * | 12/2004 | Budell et al. | 361/767 |
| 2008/0253059 A1 * | 10/2008 | Eggerding et al. | 361/301.4 |

FOREIGN PATENT DOCUMENTS

| | | |
|---|---|---|
| JP | 10-135492 | 5/1998 |
| JP | 2005-044871 | 2/2005 |
| JP | 2006-100451 | 4/2006 |
| KR | 1997-0001890 B1 | 2/1997 |
| KR | 10-2005-0067590 A | 7/2005 |

OTHER PUBLICATIONS

Korean Office Action, with English translation, issued in Korean Patent Application No. 10-2008-0077972, mailed Dec. 30, 2010.
Korean Office Action, with English Translation, issued in Korean Patent Application No. 10-2008-0077972, dated Jun. 30, 2010.
Korean Office Action, with English translation, issued in Korean Patent Application No. 10-2008-0077972, dated Aug. 31, 2011.

* cited by examiner

*Primary Examiner* — Tuan T Dinh
*Assistant Examiner* — Hung Dang
(74) *Attorney, Agent, or Firm* — McDermott Will & Emery LLP

(57) ABSTRACT

Provided is an electrode pad for mounting an electronic component on a surface of a circuit board. The electrode pad includes first and second electrode parts facing each other, and third and fourth electrode parts facing each other. The third and fourth electrode parts are disposed adjacent to the first and second electrode parts for forming corners of the electrode pad together with the first and second electrode parts. At least one of the first to fourth electrode parts includes a chamfered surface formed by cutting a corner of the at least one of the first to fourth electrode parts forming the corner of the electrode pad. Therefore, when the electrode pad is used for mounting an electronic component, the width of an outer electrode of the electronic component can be sufficiently increased, and thus the shape or size of the outer electrode can be easily adjusted.

10 Claims, 11 Drawing Sheets

ELECTRODE PAD FOR MOUNTING ELECTRONIC COMPONENT AND STRUCTURE FOR MOUNTING ELECTRONIC COMPONENT

CROSS-REFERENCE TO RELATED APPLICATIONS

This application claims the priority of Korean Patent Application No. 10-2008-0077972 filed on Aug. 8, 2008, in the Korean Intellectual Property Office, the disclosure of which is incorporated herein by reference.

BACKGROUND OF THE INVENTION

1. Field of the Invention

The present invention relates to an electrode pad for mounting an electronic component and a structure for mounting an electronic component.

2. Description of the Related Art

In general, an electrode pad is formed on a circuit board by using a material such as a metal. An electronic component, such as an optical device or an electronic device such as a capacitor, may be driven by an electric signal applied to the electronic component through the electrode pad, and an electric signal amplified or detected by the electronic component may be transmitted to an external device through the electrode pad. FIG. 1 is a plan view illustrating a four-terminal electrode pad of the related art.

Referring to FIG. 1, the electrode pad is formed on a circuit board 101 and has a four-terminal structure configured by first to fourth electrode parts 102 to 105. The electrode pad having a four-terminal structure can be used for mounting an electronic component having four outer electrodes. FIG. 2 is a plan view illustrating an electronic component mounted on the electrode pad of FIG. 1. Referring to FIG. 2, the electronic component (four-terminal electronic component) includes a main body 201, and four outer electrodes 202 to 205 formed at the main body 201. The four outer electrodes 202 to 205 are connected to the corresponding first to fourth electrode parts 102 to 105, respectively.

In FIG. 2, the electronic component is in contact with the third and fourth electrode parts 104 and 105 by a length (B) of about 250 μm, and a mounting margin (D−T) of about 100 μm is necessary. Although the electrode pad can be finely patterned, the gap (G) between the first to fourth electrode parts 102 to 105 should be at least about 50 μm. Thus, an interval between neighboring outer electrodes of the electronic component (for example, a length (A) from an edge of the main body 201 to the first outer electrode 202) is about 350 μm (B+G+(D−T)/2)

That is, when an electronic component is mounted on a circuit board using an electrode pad, the size or gap between outer electrodes of the electronic component is limited not only by the structure of the electronic component but also by the structure of the electrode pad.

SUMMARY OF THE INVENTION

An aspect of the present invention provides an electrode pad configured to mount an electronic component having a sufficiently widened outer electrode, and a structure for mounting an electronic component.

According to an aspect of the present invention, there is provided an electrode pad for mounting an electronic component on a surface of a circuit board, the electrode pad including: first and second electrode parts facing each other; and third and fourth electrode parts facing each other, the third and fourth electrode parts being disposed adjacent to the first and second electrode parts for forming corners of the electrode pad together with the first and second electrode parts, wherein at least one of the first to fourth electrode parts includes a chamfered surface, and the chamfered surface is formed by cutting a corner of the at least one of the first to fourth electrode parts forming the corner of the electrode pad.

At least two neighboring electrode parts of the first to fourth electrode parts may have chamfered surfaces that face each other. The chamfered surfaces may be parallel to each other. The chambered surfaces may be spaced apart from each other by about 50 μm to about 250 μm.

The electrode pad may have a rectangular shape, and the first and second electrode parts may be longer than the third and fourth electrode parts.

Each of the first and second electrode parts may be divided into at least two sub parts. Alternatively, each of the first and second electrode parts may be divided into at least three sub parts, and neighboring sub parts of the sub parts may have different polarities.

According to another aspect of the present invention, there is provided a structure for mounting an electronic component, the structure including: a circuit board; an electrode pad disposed at the circuit board and including first to fourth electrode parts; and an electronic component including a main body and first to fourth outer electrodes disposed at an outer surface of the main body, the electronic component being mounted on the circuit board by connecting the first to fourth outer electrodes to the first to fourth electrode parts, respectively, wherein the first and second electrode parts face each other, the third and fourth electrode parts face each other, the third and fourth electrode parts are disposed adjacent to the first and second electrode parts for forming corners of the electrode pad together with the first and second electrode parts, and at least one of the first to fourth electrode parts includes a chamfered surface formed by cutting a corner of the at least one of the first to fourth electrode parts forming the corner of the electrode pad.

The electronic component may be a ceramic electronic component, and the main body of the electronic component may be formed of a ceramic material. The electronic component may be a multilayer chip capacitor (MLCC), and the electronic component may include a plurality of dielectric layers stacked in the main body and a plurality of inner electrodes alternately stacked in the main body between the dielectric layers. In this case, the electronic component may include first to fourth inner electrodes respectively connected to the first to fourth outer electrodes through leads. The MLCC may be a four-terminal MLCC including the first to fourth outer electrodes as terminals.

At least one of the first to fourth outer electrodes may have an arc shape at a portion connected to the electrode pad. In this case, apexes of neighboring two of the first to fourth outer electrodes may be spaced apart from each other by about 100 μm to about 150 μm.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
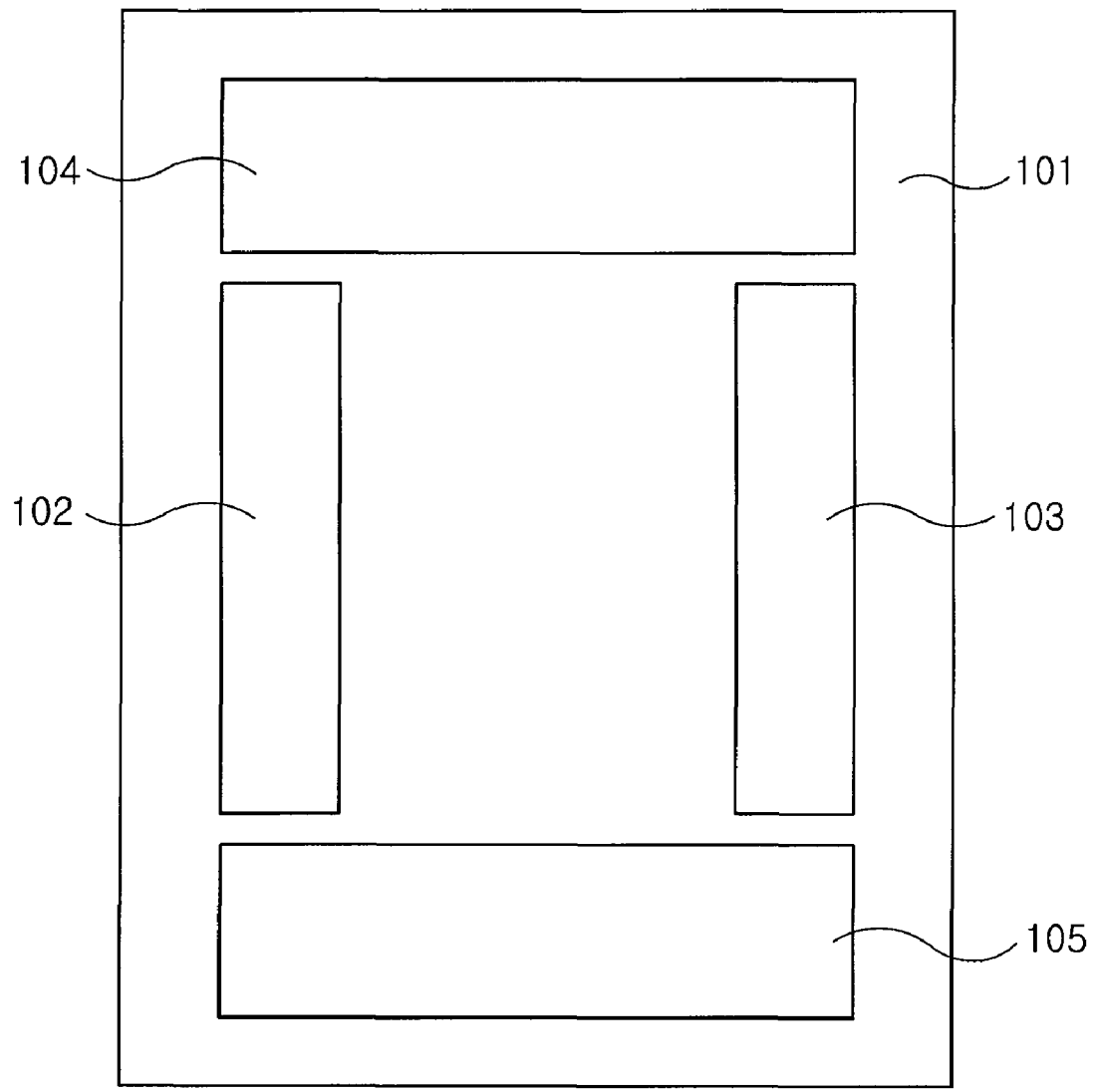
FIG. 1 is a plan view illustrating an electrode pad having a four-terminal structure according to the related art.
Figure 2:
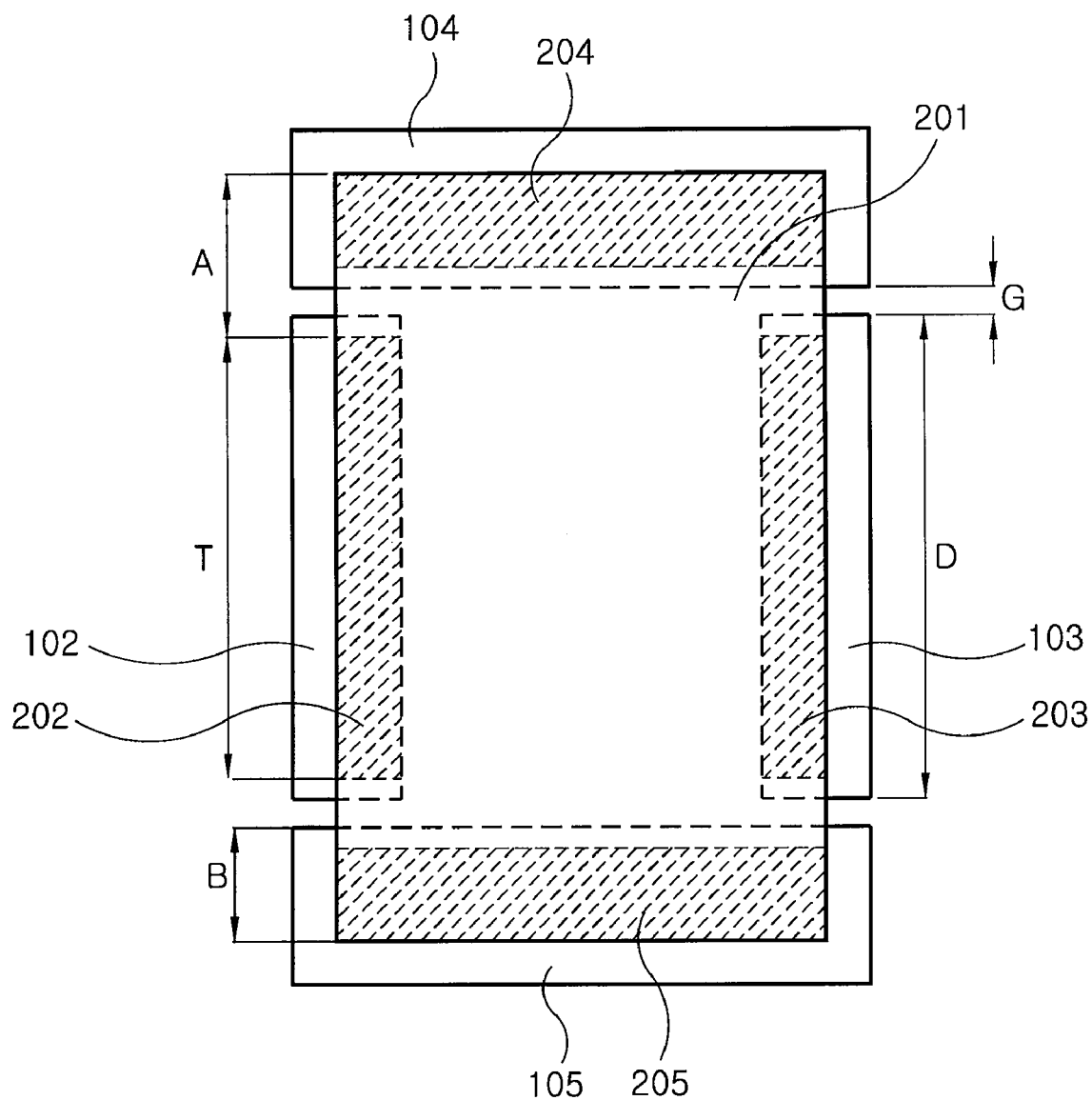
FIG. 2 is a plan view illustrating an electronic component mounted on the electrode pad of FIG. 1.

Exemplary embodiments of the present invention will now be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the present invention to those skilled in the art. In the drawings, the sizes and shapes of elements are exaggerated for clarity, and like reference numerals denote like elements.

Figure 3:
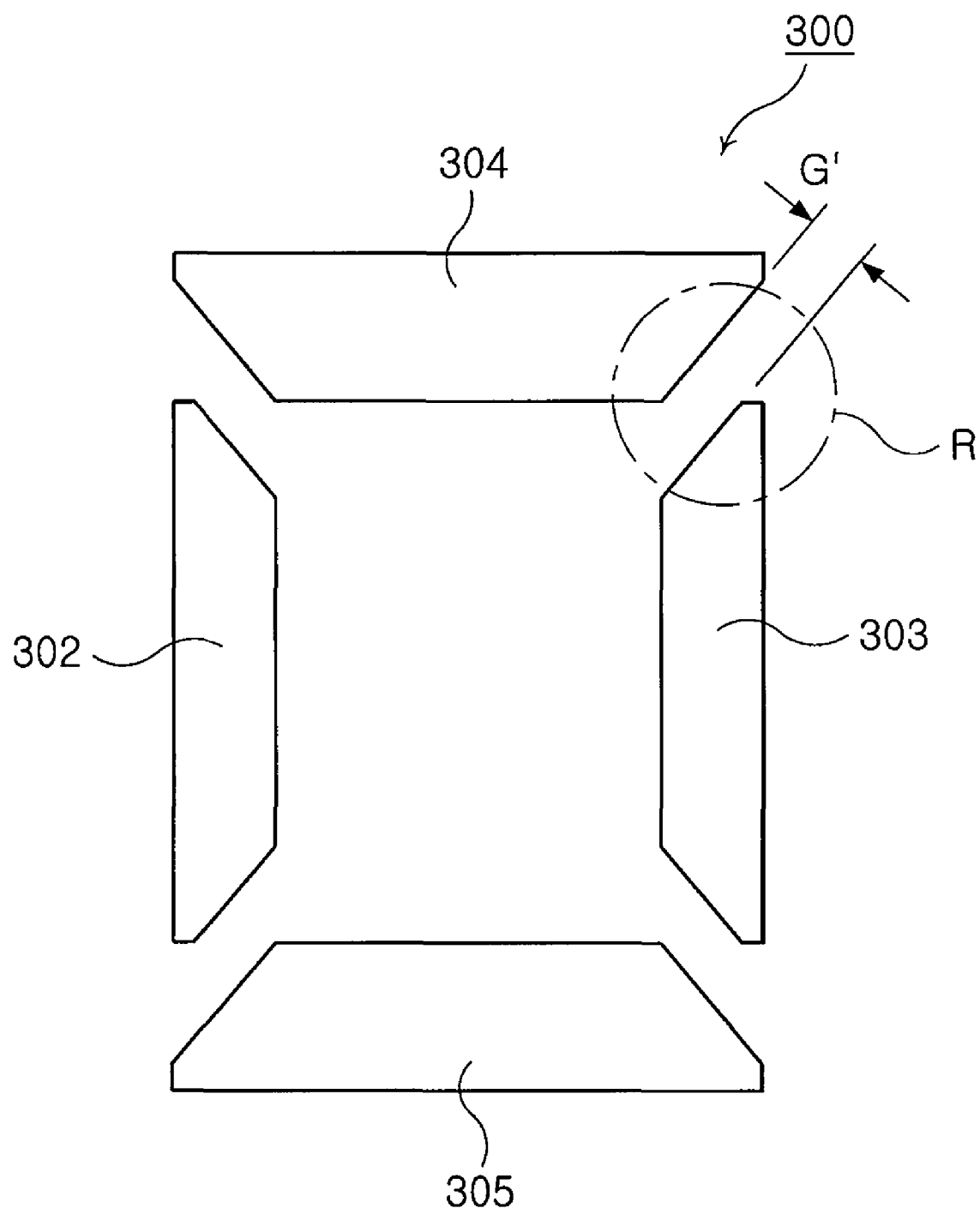
FIG. 3 is a plan view illustrating an electrode pad for mounting an electronic component according to an embodiment of the present invention.
Figure 4:
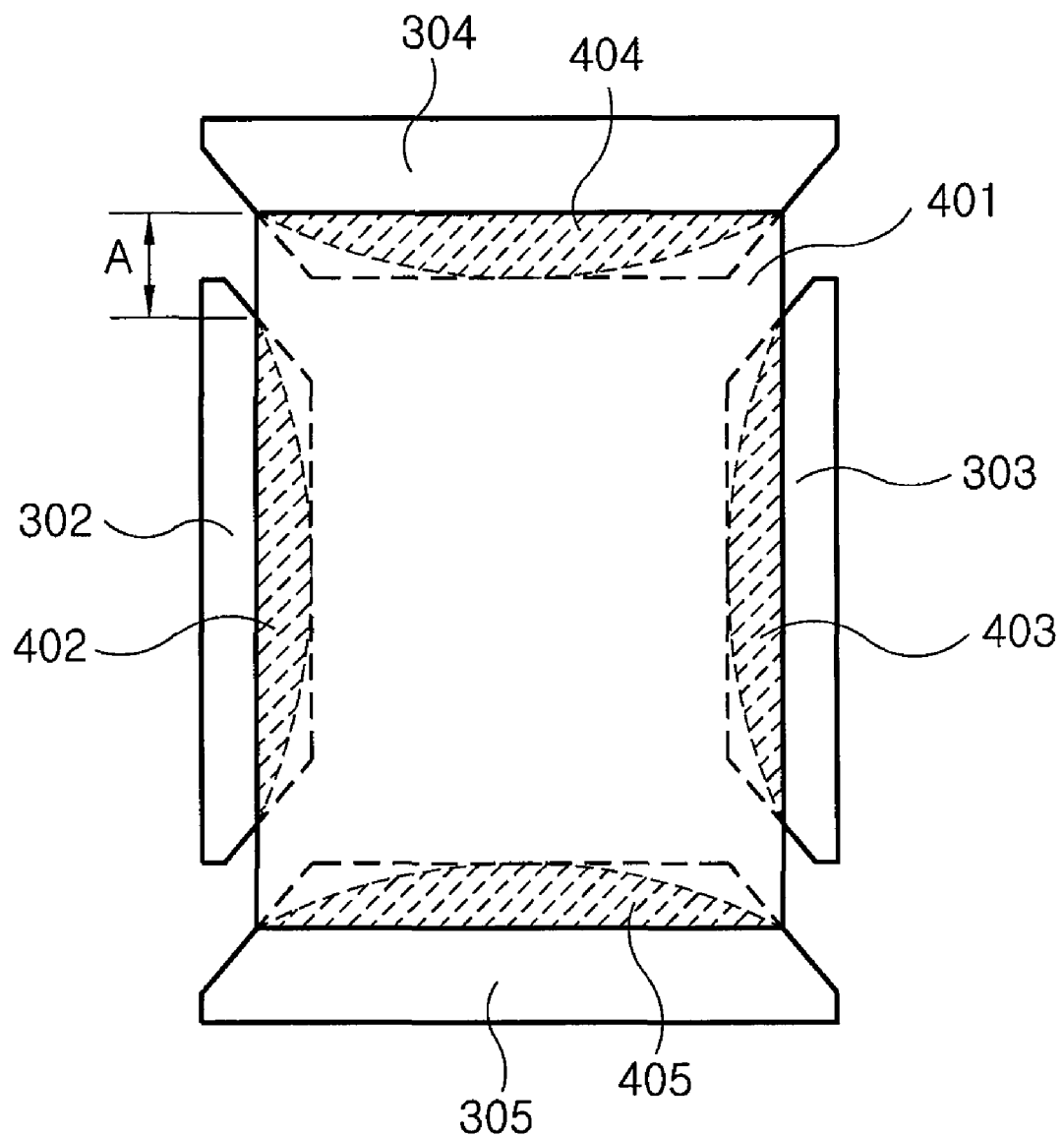
FIG. 4 is a plan view illustrating an electronic component mounted on the electrode pad of FIG. 3.
Figure 5:
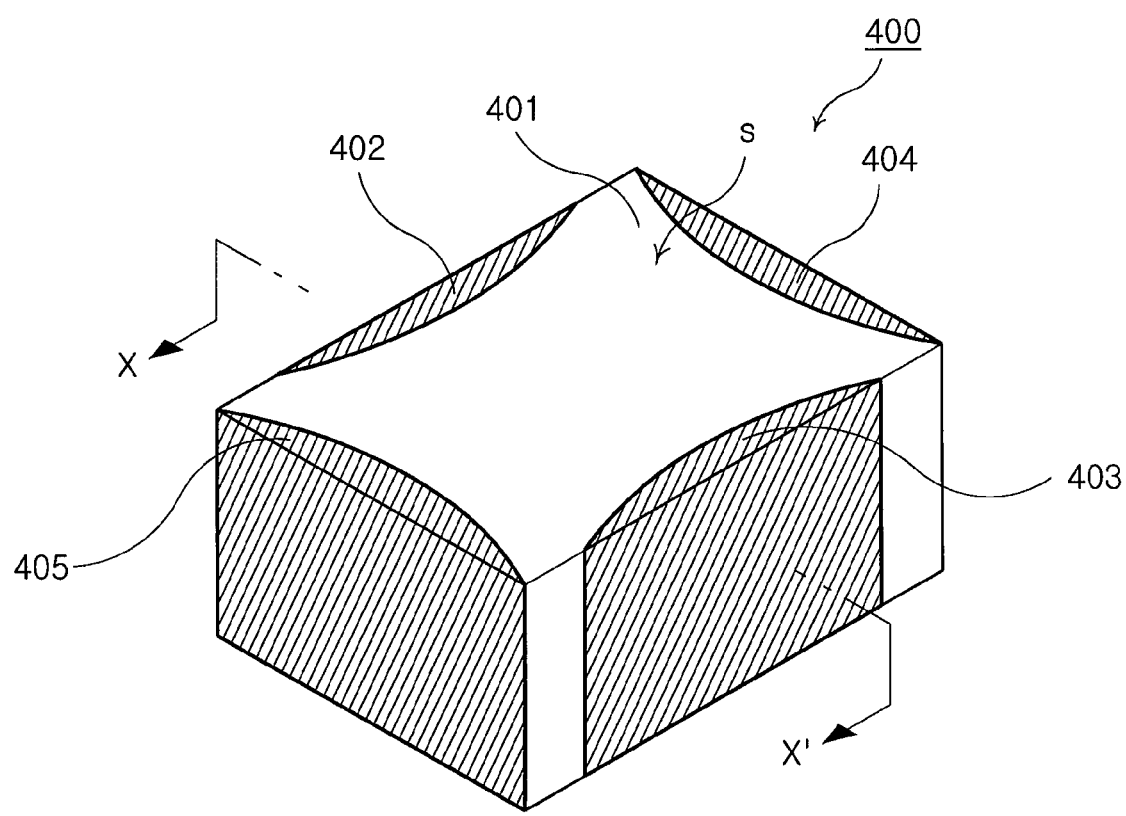
FIG. 5 is a perspective view illustrating the electronic component depicted in FIG. 4.
Figure 6:
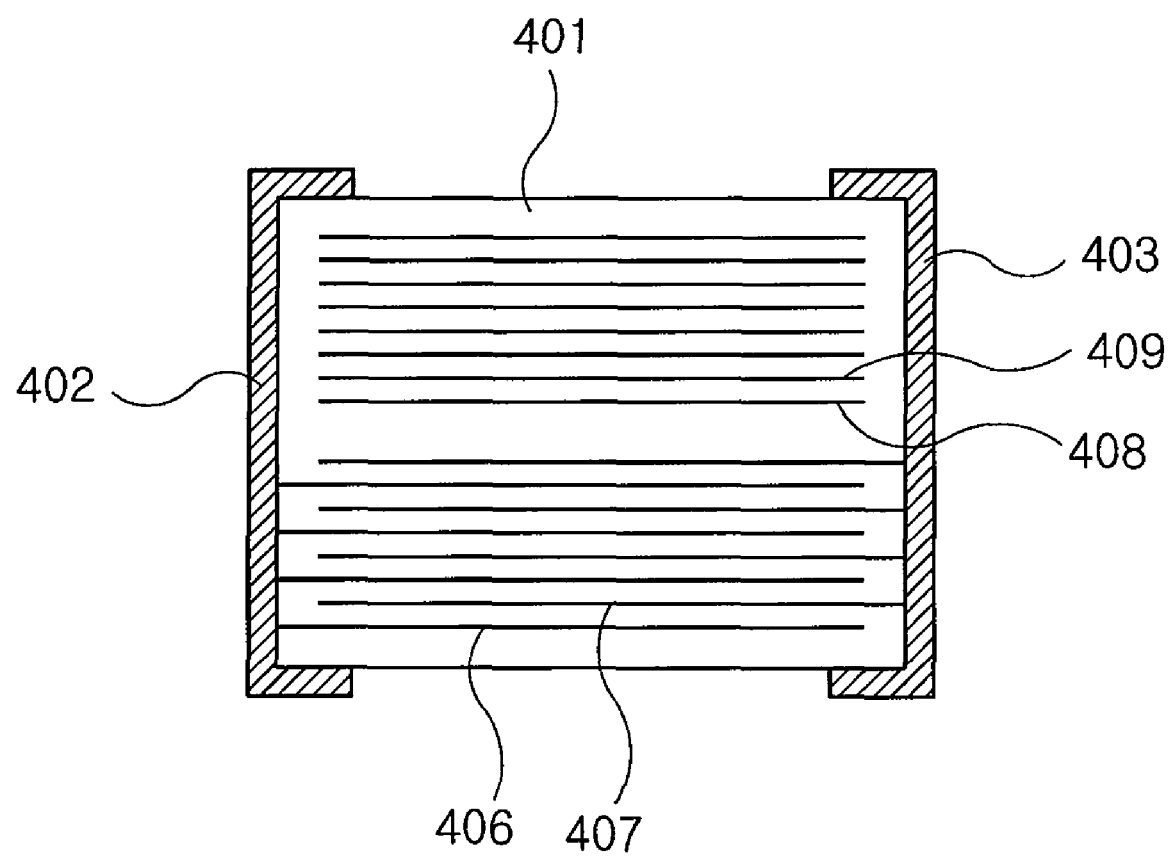
FIG. 6 is a sectional view taken along line X-X' of FIG. 5.

FIG. 3 is a plan view illustrating an electrode pad 300 for mounting an electronic component according to an embodiment of the present invention; FIG. 4 is a plan view illustrating an electronic component 400 mounted on the electrode pad 300 of FIG. 3; FIG. 5 is a perspective view illustrating the electronic component 400 depicted in FIG. 4; and FIG. 6 is a sectional view taken along line X-X' of FIG. 5.

Referring to FIG. 3, in the current embodiment, the electrode pad 300 for mounting an electronic component (hereinafter, simply refer to as an electrode pad 300) is a four-terminal electrode pad including first to fourth electrode parts 302 to 305 formed of a conductive material such as metal. In the current embodiment, corners of the first to fourth electrode parts 302 to 305 of the electrode pad 300 are chamfered. That is, as shown in FIG. 3, neighboring corners of the first electrode part 302 and the third and fourth electrode parts 304 and 305, and neighboring corners of the second electrode part 303 and the third and fourth electrode parts 304 and 305 are removed to form chamfered surfaces. In this case, neighboring pairs of the chamfered surfaces of the first to fourth electrode parts 302 to 305 may be parallel. In FIG. 3, all the first to fourth electrode parts 302 to 305 have chamfered surfaces; however, if necessary, only some of the first to fourth electrode parts 302 to 305 may have chambered surfaces.

In the current embodiment, about 250-μm gaps G' can be formed between the first to fourth electrode parts 302 to 305 by chambering the corners of the first to fourth electrode parts 302 to 305. That is, since necessary gaps G' are formed between the first to fourth electrode parts 302 to 305 by chambering, the lengths of the first to fourth electrode parts 302 to 305 can be increased, and thus, the lengths of outer electrodes of the electronic component 400 can be increased. In detail, referring to FIGS. 4 and 5, the electronic component 400 mounted on the electrode pad 300 includes a main body 401 and first to fourth outer electrodes 402 to 405 formed at outer surfaces of the main body 401. Gaps (A) between the first to fourth outer electrodes 402 to 405 can be reduced to about 150 μm. A surface (S) (refer to FIG. 5) of the electronic component 400 may be coupled to the electrode pad 300.

In the related art, an electronic component is mounted on an electrode pad including non-chambered electrode parts, and thus, it is difficult to reduce gaps between outer electrodes of the electronic component to about 350 μm or smaller. However, according to the current embodiment, the gaps (A) between the outer electrodes 402 to 405 of the electronic component 400 can be significantly reduced, and thus the lengths of the outer electrodes 402 to 405 can be increased. Particularly, as shown in FIGS. 4 and 5, the outer electrodes 402 to 405 of the electronic component 400 can be formed into an arc shape (segment of a circle). In this case, the outer electrodes 402 to 405 can be further elongated toward corner regions of the main body 401. The outer electrodes 402 to 405 may be formed into an arc shape by applying an electrode material to the main body 401 using a dipping or wheel method.

The electronic component 400 may be any type of component mountable on a circuit board. In the following description, effects by the increased lengths of the outer electrodes 402 to 405 of the electronic component 400 will be explained for the case where the electronic component 400 is a multilayer chip capacitor (MLCC) (a kind of ceramic electronic component). The MLCC can be used as a decoupling capacitor in a power distributor of a micro process unit (MPU), and in this case, the equivalent series inductance (ESL) of the MLCC should be low for improving high-frequency noise filtering and suppressing characteristics.

Figure 7:
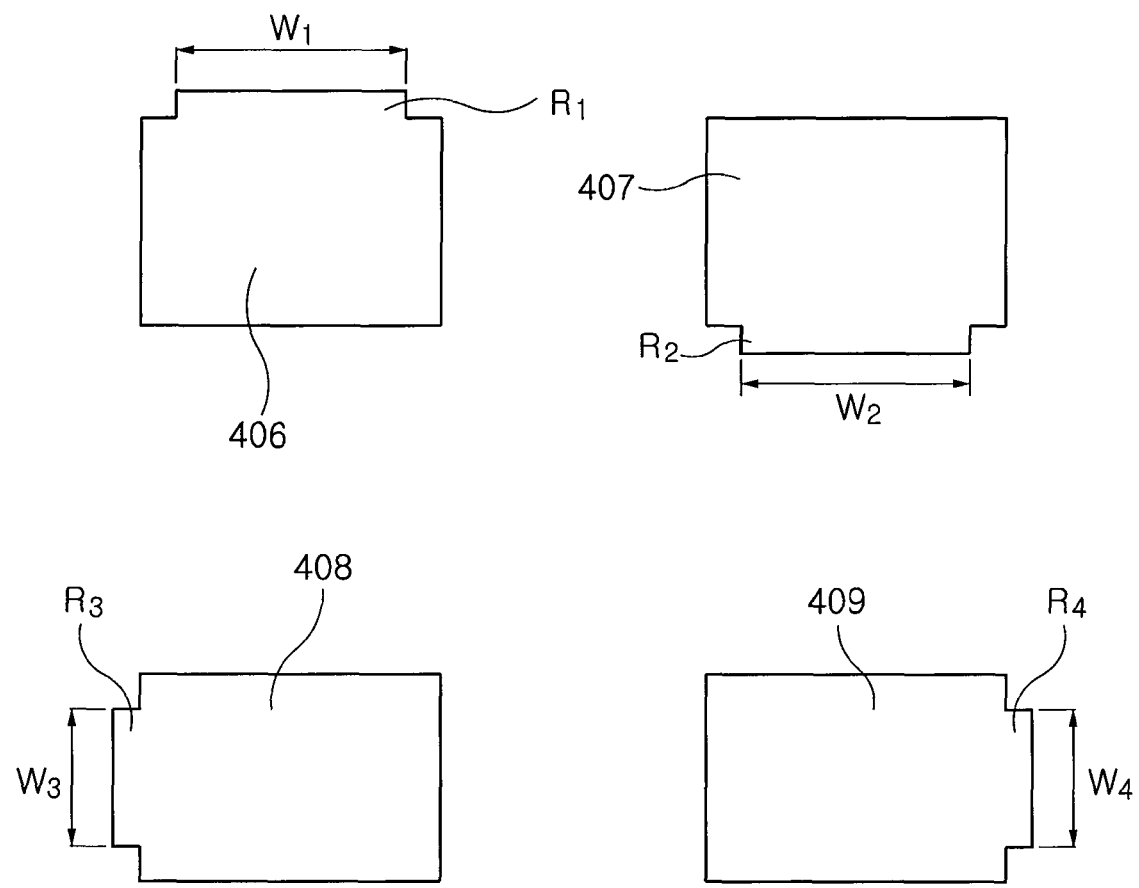
FIG. 7 is a plan view illustrating shapes of inner electrodes depicted in FIG. 6.

Referring to FIG. 6, the main body 401 of the electronic component 400 (an MLCC) has a stacked structure formed by a plurality of dielectric layers. The main body 401 includes first to fourth inner electrodes 406 to 409 disposed between the dielectric layers for obtain desired capacitance. The first and second inner electrodes 406 and 407 are connected to the first and second outer electrodes 402 and 403, respectively. The third and fourth inner electrodes 408 and 409 are connected to the third and fourth outer electrodes 404 and 405, respectively. FIG. 7 is a plan view illustrating shapes of the first to fourth inner electrodes 406 to 409 depicted in FIG. 6. Referring to FIG. 7, the first to fourth inner electrodes 406 to 409 include leads R1 to R4, respectively. The leads R1 to R4 of the first to fourth inner electrodes 406 to 409 are connected to the first to fourth outer electrodes 402 to 405, respectively.

The widths of the leads R1 to R4 of the inner electrodes 406 and 409 should be large to increase the widths of current passages, and thus to reduce the ESL of the electronic component 400 (an MLCC). In the current embodiment, as described above, the outer electrodes 402 to 405 can have sufficiently large lengths for mounting the MLCC on the electrode pad 300, and thus, the inner electrodes 406 and 409 connected to the outer electrodes 404 and 405 can have sufficiently large widths. That is, as shown in FIG. 7, the leads R1 to R4 of the inner electrodes 406 and 409 of the electronic component 400 can have sufficiently large widths W1 to W4 as compared with the case where the electronic component 400 is mounted on an electrode pad of the related art.

Figure 8:
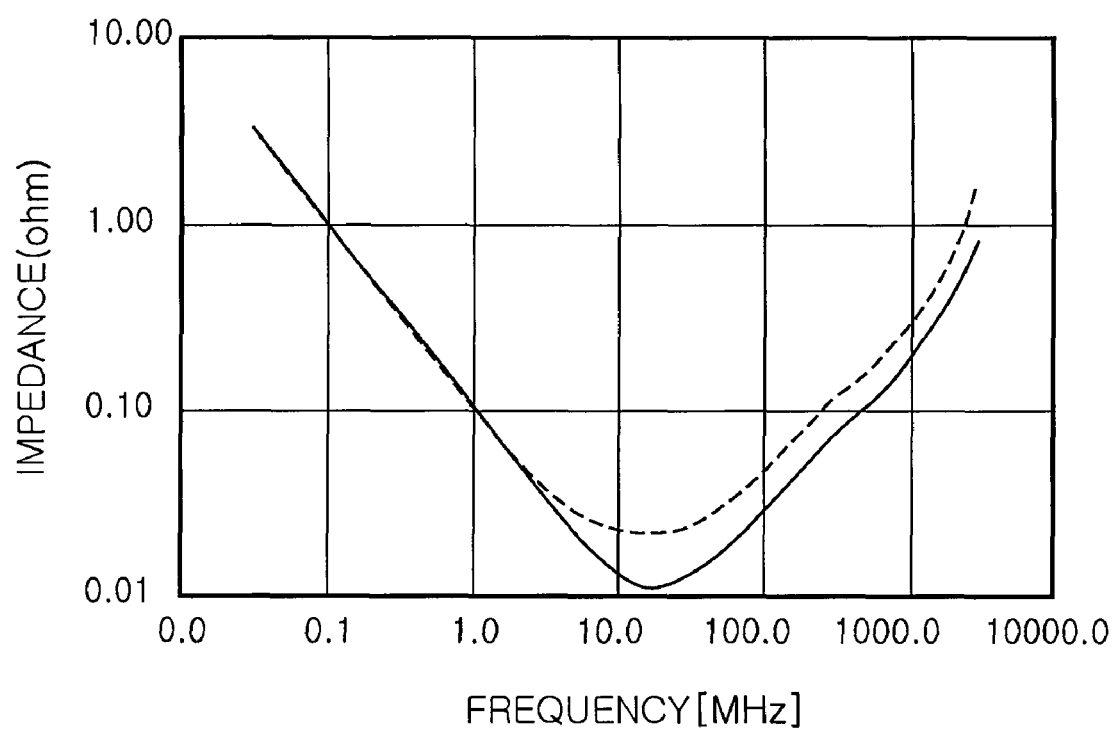
FIG. 8 is a simulation graph for comparing the impedance characteristics of a multilayer chip capacitor (MLCC) having the same structure as that illustrated in FIG. 5 (indicated by a solid curve) with those of an MLCC of the related art (indicated by a dashed line)

FIG. 8 is a simulation graph for comparing the impedance characteristics of an MLCC having the same structure as that illustrated in FIG. 5 (indicated by a solid curve) with those of an MLCC of the related art (indicated by a dashed line). In FIG. 8, the MLCC of the related art is an MLCC configured to be mounted on a non-chamfered electrode pad, and neighboring outer electrodes of the MLCC are spaced apart from each other by about 350 μm. Referring to FIG. 8, the MLCC of the current embodiment has relative low impedance at a high-frequency range (higher than the resonant frequency) as compared with the MLCC of the related art. The reason for this may be that the ESL of the MLCC is lowered owing to the increased width of the inner electrodes of the MLCC.

Figure 9:
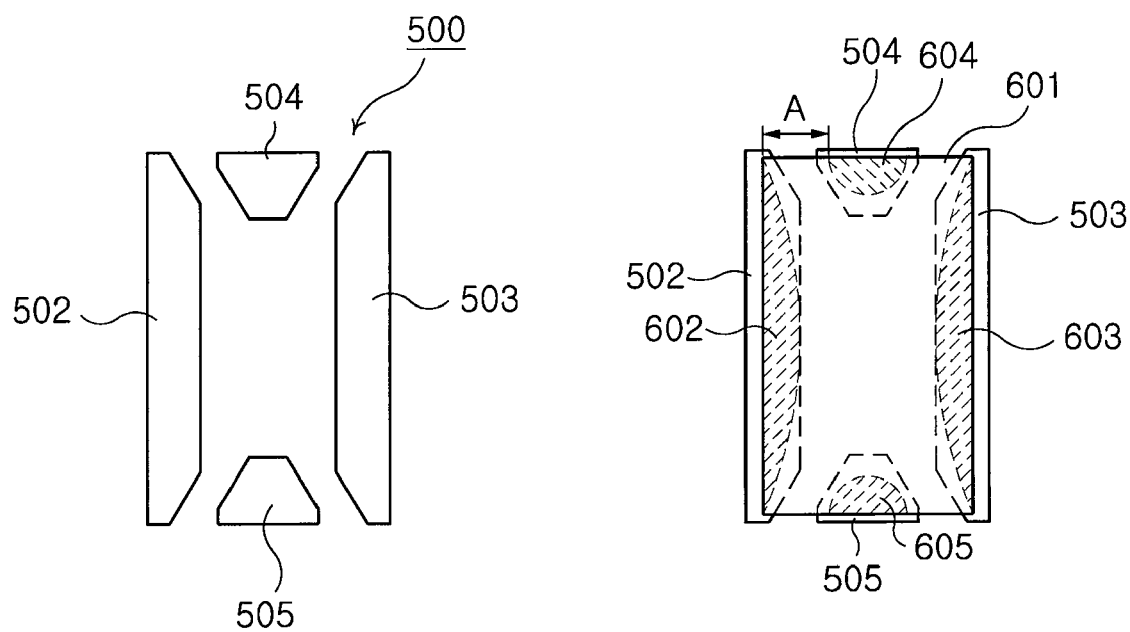
FIGS. 9 and 10 are plan views illustrating electrode pads and electronic components mounted on the electrode pads according to other embodiments of the present invention.
Figure 10:
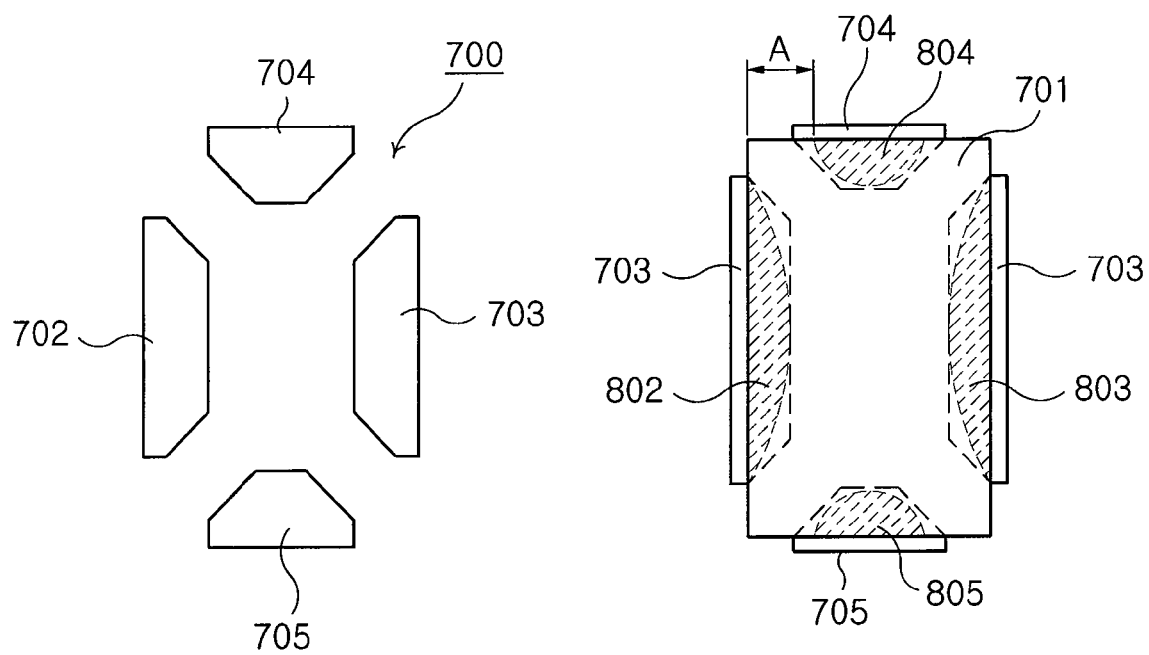

FIGS. 9 and 10 are plan views illustrating electrode pads 500 and 700 and electronic components mounted on the electrode pads 500 and 700 according to other embodiments of the present invention. Referring to FIG. 9, the electrode pad 500 includes first to fourth electrode parts 502 to 505, and corners of the first to fourth electrode parts 502 to 505 are chamfered. The electronic component may be mounted on the electrode pad 500 through first to fourth outer electrodes 602 to 605 formed at a main body 601 of the electronic component. According to the structure shown in FIG. 9, the distance (A) between the first to fourth outer electrodes 602 to 605 can be reduced to about 150 μm.

Referring to FIG. 10, the electrode pad 700 includes first to fourth electrode parts 702 to 705, and the length of the first and second electrode parts 702 and 703 is smaller than that of the first and second electrode parts 502 and 503 illustrated in FIG. 9. Corners of the first to fourth electrode parts 702 to 705 are chamfered. The electronic component may be mounted on the electrode pad 700 through first to fourth outer electrodes 802 to 805 formed at a main body 801 of the electronic component. According to the structure shown in FIG. 10, the distance (A) between the first to fourth outer electrodes 802 to 805 can be reduced to about 100 μm.

Figure 11:
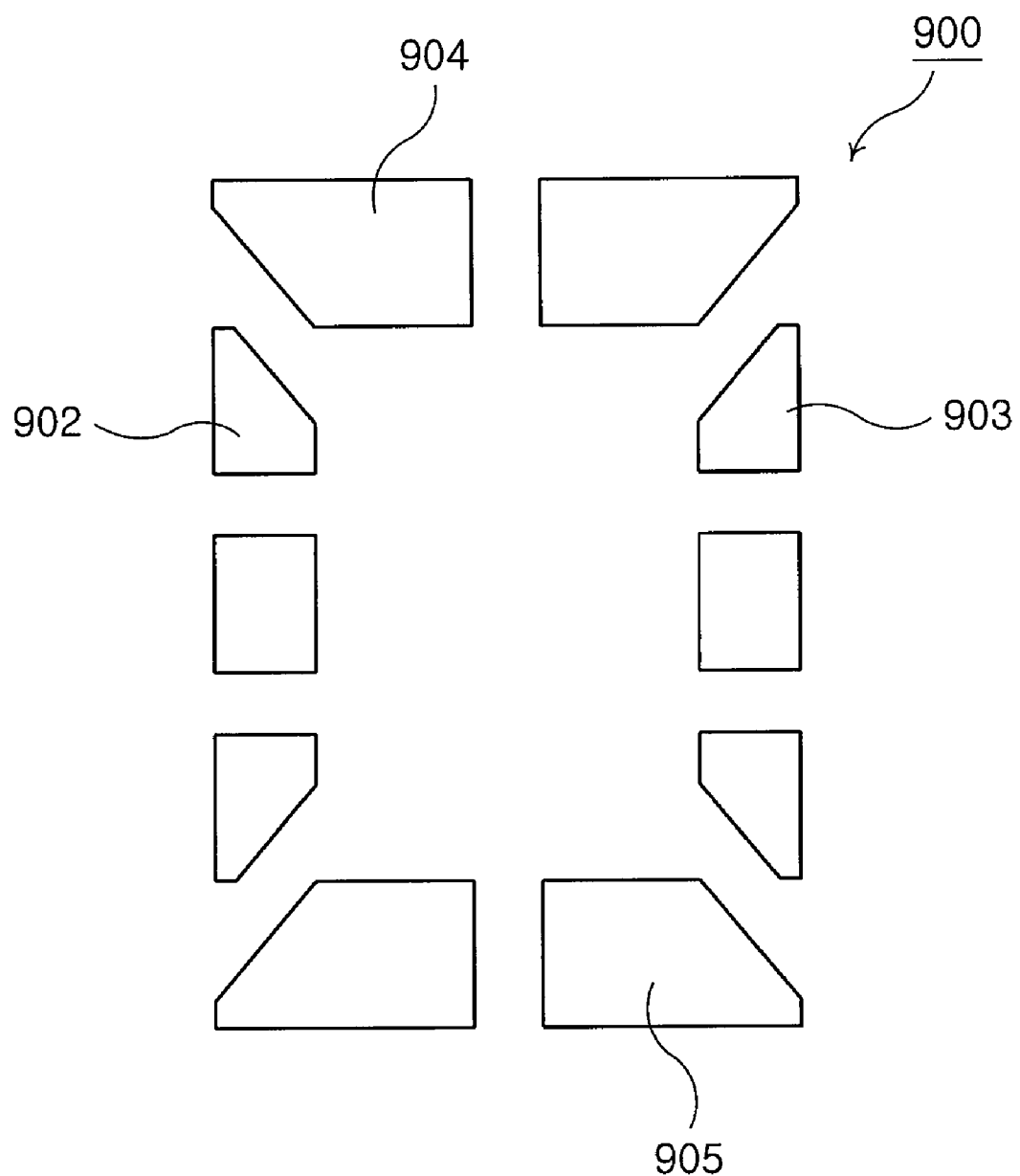
FIG. 11 is a plan view illustrating an electrode pad according to another embodiment of the present invention.

FIG. 11 is a plan view illustrating an electrode pad 900 according to another embodiment of the present invention. The electrode pad 900 includes first to fourth electrode parts 902 to 905, and corners of the first to fourth electrode parts 902 to 905 are chamfered. In the current embodiment, the first to fourth electrode parts 902 to 905 are divided into sub parts, such that the electrode pad 900 can be used for mounting an eight-terminal electronic component. The first to fourth electrode parts 902 to 905 can be divided into more sub parts for mounting an electronic component such as a ten-terminal electronic component or an eleven-terminal electronic component.

As described above, when the electrode pad of the present invention is used for mounting an electronic component, the width of an outer electrode of the electronic component can be sufficiently increased, and thus the shape or size of the outer electrode of the electronic component can be easily adjusted. In addition, in the case where the electronic component is an MLCC, an inner electrode of the MLCC can also be widened owing to the increased width of the outer electrode, and thus, the impedance of the MLCC can be reduced in a high-frequency range.

While the present invention has been shown and described in connection with the exemplary embodiments, it will be apparent to those skilled in the art that modifications and variations can be made without departing from the spirit and scope of the invention as defined by the appended claims.

What is claimed is:

1. An electrode pad for mounting an electronic component on a surface of a circuit board, the electrode pad comprising:
    first and second electrode parts facing each other; and
    third and fourth electrode parts facing each other, the third and fourth electrode parts being disposed adjacent the first and second electrode parts for forming corners of the electrode pad together with the first and second electrode parts, wherein the first to fourth electrode parts comprise chamfered surfaces, and the chamfered surfaces are cut corners of the first to fourth electrode parts forming the corners of the electrode pad, wherein the electrode pad is directly connected to outer electrodes of the electronic component with a solder, wherein the chamfered surfaces are spaced apart from each other by 50 μm to 250 μm and the outer electrodes of the electronic component are spaced apart from each other by about 100 μm to about 150 μm, and wherein chamfered surfaces of the first electrode part, face, and are parallel to, chamfered surfaces of the third and the fourth electrode parts, and chamfered surfaces of the second electrode part, face, and are parallel to, the chamfered surfaces of the third and fourth electrode parts.

2. The electrode pad of claim 1, wherein the electrode pad has a rectangular shape, and the first and second electrode parts are longer than the third and fourth electrode parts.

3. The electrode pad of claim 1, wherein each of the first and second electrode parts is divided into at least two sub parts.

4. The electrode pad of claim 3, wherein each of the first and second electrode parts is divided into at least three sub parts, and neighboring sub parts of the sub parts have different polarities.

5. A structure for mounting an electronic component, the structure comprising:
    a circuit board;
    an electrode pad disposed at the circuit board and comprising first to fourth electrode parts; and
    an electronic component comprising a main body and first to fourth outer electrodes disposed at an outer surface of the main body, the electronic component being mounted on the circuit board by connecting the first to fourth outer electrodes to the first to fourth electrode parts, respectively, wherein the first and second electrode parts face each other,
    the third and fourth electrode parts face each other,
    the third and fourth electrode parts are disposed adjacent to the first and second electrode parts for forming corners of the electrode pad together with the first and second electrode parts, and the first to fourth electrode parts comprises chamfered surfaces, which are cut corners of the first to fourth electrode parts forming the corners of the electrode pad, and wherein the electrode pad is directly connected to the outer electrodes of the electronic component with a solder, wherein the chamfered surfaces are spaced apart from each other by 50 μm to 250 μm and the outer electrodes of the electronic component are spaced apart from each other by about 100 μm to about 150 μm, and wherein chamfered surfaces of the first electrode part, face, and are parallel to, chamfered surfaces of the third and the fourth electrode parts, and chamfered surfaces of the second electrode part, face, and are parallel to, the chamfered surfaces of the third and fourth electrode parts.

6. The structure of claim 5, wherein the electronic component is a ceramic electronic component, and the main body of the electronic component is formed of a ceramic material.

7. The structure of claim 5, wherein the electronic component is a multilayer chip capacitor (MLCC), and
the electronic component comprises a plurality of dielectric layers stacked in the main body and a plurality of inner electrodes alternately stacked in the main body between the dielectric layers.

8. The structure of claim 7, wherein the electronic component comprises first to fourth inner electrodes respectively connected to the first to fourth outer electrodes through leads.

9. The structure of claim 7, wherein the MLCC is a four-terminal MLCC comprising the first to fourth outer electrodes as terminals.

10. The structure of claim 5, wherein at least one of the first to fourth outer electrodes has an arc shape at a portion connected to the electrode pad.

* * * * *